(12) United States Patent
Uchiyama et al.

(10) Patent No.: US 10,035,711 B2
(45) Date of Patent: Jul. 31, 2018

(54) DIELECTRIC FILM AND ELECTRONIC COMPONENT

(71) Applicant: TDK CORPORATION, Tokyo (JP)

(72) Inventors: Hiroki Uchiyama, Tokyo (JP); Raitarou Masaoka, Tokyo (JP); Shohei Fujii, Tokyo (JP); Maiko Shirokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/459,306

(22) Filed: Mar. 15, 2017

(65) Prior Publication Data

US 2017/0275174 A1    Sep. 28, 2017

(30) Foreign Application Priority Data

Mar. 22, 2016    (JP) .................... 2016-056794

(51) Int. Cl.
  *C04B 35/03*    (2006.01)
  *C01F 11/02*    (2006.01)
  (Continued)

(52) U.S. Cl.
  CPC ............... *C01F 11/02* (2013.01); *C01F 5/02* (2013.01); *C04B 35/03* (2013.01); *C04B 35/04* (2013.01); *C04B 35/057* (2013.01); *C04B 35/486* (2013.01); *C04B 35/62218* (2013.01); *C23C 14/082* (2013.01); *C23C 14/185* (2013.01); *C23C 14/3414* (2013.01); *H01G 4/085* (2013.01); *H01G 4/10* (2013.01); *H01G 4/1227* (2013.01); *H01G 4/33* (2013.01); *H01L 21/02175* (2013.01); *H01L 21/02194* (2013.01); *H01L 21/02266* (2013.01); *H01L 28/55* (2013.01); *C01P 2002/74* (2013.01); *C04B 2235/3205* (2013.01); *C04B 2235/3206* (2013.01); *C04B 2235/3208* (2013.01); (Continued)

(58) Field of Classification Search
  CPC ...... C03C 2217/228; C04B 2235/3208; C04B 2235/3224; C04B 2235/3225; C04B 2235/3227; C04B 2235/3229; C04B 2235/3272; C04B 2235/3418; C04B 2235/5427; C04B 2235/5436; C04B 2235/72; C04B 2235/77
  See application file for complete search history.

(56) References Cited

U.S. PATENT DOCUMENTS

2008/0003460 A1*    1/2008    Sakurai ............ C03C 17/245
                                                            428/702

FOREIGN PATENT DOCUMENTS

CN    101274821 A    10/2008

OTHER PUBLICATIONS

Lee et al. Texture and cross-sectional microstructure of MgO films grown on silicon dioxide by electron-beam evaporation. Thin Solid Films vol. 354, Issues 1-2, Oct. 8, 1999, pp. 82-86.*

(Continued)

*Primary Examiner* — Noah S Wiese
(74) *Attorney, Agent, or Firm* — Oliff PLC

(57) ABSTRACT

A dielectric film containing an alkaline earth metal oxide having a NaCl type crystal structure as a main component, wherein the dielectric film has a (111)-oriented columnar structure in a direction perpendicular to the surface of the dielectric film, and in a Cu—Kα X-ray diffraction chart of the dielectric film, a half width of the diffraction peak of (111) is in a range of from 0.3° to 2.0°.

6 Claims, 2 Drawing Sheets

(51) Int. Cl.

| | |
|---|---|
| *C01F 5/02* | (2006.01) |
| *C04B 35/04* | (2006.01) |
| *C04B 35/057* | (2006.01) |
| *C04B 35/622* | (2006.01) |
| *C23C 14/08* | (2006.01) |
| *C23C 14/18* | (2006.01) |
| *C23C 14/34* | (2006.01) |
| *H01G 4/10* | (2006.01) |
| *H01G 4/33* | (2006.01) |
| *C04B 35/486* | (2006.01) |
| *H01G 4/08* | (2006.01) |
| *H01G 4/12* | (2006.01) |
| *H01L 21/02* | (2006.01) |
| *H01L 49/02* | (2006.01) |

(52) U.S. Cl.
CPC ......... *C04B 2235/3213* (2013.01); *C04B 2235/3215* (2013.01); *C04B 2235/3236* (2013.01); *C04B 2235/3239* (2013.01); *C04B 2235/3244* (2013.01); *C04B 2235/3248* (2013.01); *C04B 2235/3255* (2013.01); *C04B 2235/3284* (2013.01); *C04B 2235/762* (2013.01)

(56) References Cited

OTHER PUBLICATIONS

Ho, In-Chyuan et al., "Electrical and Optical Properties of MgO Thin Film Prepared by Sol-Gel Technique," Journal of Sol-Gel Science and Technology, 1997, pp. 295-301, vol. 9, Kluwer Academic Publishers.

Lee, J. S. et al., "Texture and cross-sectional microstructure of MgO films grown on silicon dioxide by electron-beam evaporation," Thin Solid Films, 1999, pp. 82-86, vol. 354.

Kazuo, Uetani et al., "Ion-plating deposition of MgO protective layer for AC-plasma display panels," Mat. Res. Soc. Symp. Proc., 2001, vol. 647.

Pieter, Ghekiere et al., "Growth mechanism of biaxially aligned magnesium oxide deposited by unbalanced magnetron sputtering," Sold State Phenomena, 2005, vol. 105.

Jul. 5, 2017 Extended Search Report issued in European Patent Application No. 17161382.1.

Tarsa et al., "Growth and characterization of (111) and (001) oriented MgO films on (001) GaAs," Journal of Applied Physics, vol. 73, pp. 3276-3283 (1993).

* cited by examiner

DIELECTRIC FILM AND ELECTRONIC COMPONENT

The present invention relates to a dielectric film and an electronic component.

BACKGROUND

In order to cope with the requirements in the communication with a further high-speed and large capacity of mobile communication devices typified by smart phones and tablets, the MIMO technology (Multi-Input Multi-Output) using multiple frequency bands at the same time is beginning to be put into practical use. If the frequency bands used for communication increases, high frequency components are required for each frequency band respectively. Thus, in order to increase the number of the components while maintaining the equipment size, further miniaturization and higher functionality of each component is required.

As such electronic components corresponding to the high frequency, there are components such as a diplexer, a band pass filter or the like. They are all constituted by a combination of dielectric materials functioning as capacitors and magnetic materials functioning as inductors. However, it is required to suppress the losses respectively under a high frequency region in order to obtain a good high frequency property.

Regarding to the dielectric materials, requirements are demanded as follows. (1) Firstly, corresponding to the demand for miniaturization, the relative permittivity (εr) is demanded to be high in order to reduce the area of the capacitor part; (2) secondly, in order to make the selectivity of frequency good, the dielectric loss is required to be small, that is, the Q value is required to be high; and (3) thirdly, the dielectric breakdown voltage is required to be high.

For example, an amorphous $SiN_x$ film has a high Q value of about 500 at high frequency (2 GHz) and a dielectric breakdown voltage as high as about 500 V/μm to 700 V/μm, thus, it is generally widely used in the electronic components corresponding to high frequency. However, its relative permittivity is as low as about 7, thus, a large electrode area is required to have a desired function, and it has been difficult to meet the demand for miniaturization. In addition, accompanying with the progress of the communication technology in recent years, a further improvement of characteristics of high frequency components is desired, that is, a dielectric material having a higher Q value and a higher dielectric breakdown voltage is demanded. In order to meet such demands, dielectric films mainly composed of NaCl type alkaline earth metals represented by MgO, CaO or the like have begun to be studied in recent years. As the reason, it is because that a thick film having a thickness of 1 μm or more has characteristics better than the amorphous $SiN_x$ film, that is, it has a higher relative permittivity (>7), a higher Q value (>500) and breakdown voltage (>700 V/μm).

In Non-patent Document 1, a technique has been disclosed where a MgO thick film having a NaCl type crystal structure is formed into a thin film having a thickness of less than 1 μm. It is reported that the fabricated MgO thin film has a thickness of 260 nm and a dielectric breakdown voltage (Vbd) of 80 V/μm, while εr=7 and Q=20 under a measuring frequency of 1 KHz.

Non-Patent Documents

Non-Patent Document 1: Journal of Sol-Gel Science and Technology, Vol 9, 295-301(1997), Electrical and Optical Properties of MgO Thin Film Prepared by Sol-Gel Technique.

SUMMARY

As can be seen from the characteristics of the dielectric film obtained in Non-patent Document 1, the high relative permittivity, the high Q value and the dielectric breakdown voltage conventionally obtained in the MgO thick film are decreased sharply by thinning the film. Even if the characteristic value of the obtained dielectric film is observed, it is lower than the characteristic of the amorphous $SiN_x$ film, which is certainly insufficient for use in high frequency components. As described above, there is a problem that the dielectric film containing the NaCl type alkaline earth metal as the main component hardly exhibits favorable characteristics in the thin film. At the present, as one of the reasons, it is considered to be that the film structure of the dielectric film is not optimized.

The present invention has been made in accordance with the above situations and aims to provide a dielectric film containing an alkaline earth metal oxide having a NaCl type crystal structure as a main component, and an electronic component using the dielectric film, of which a high relative permittivity, a high Q value and a high dielectric breakdown voltage can be obtained even if the film thickness is 1 μm or less In order to achieve the above aims, the dielectric film according to the present invention comprises an alkaline earth metal oxide having a NaCl type crystal structure as a main component, wherein the dielectric film has a (111)-oriented columnar structure in the direction perpendicular to the surface of the dielectric film, and in a Cu—Kα X-ray diffraction chart of the dielectric film, a half width of the diffraction peak of (111) is in a range of from 0.3° to 2.0°.

By having the above characteristics, a dielectric film containing an alkaline earth metal oxide having a NaCl type crystal structure as a main component can manufacture a dielectric film and an electronic component thereof, which show a high relative permittivity, a high Q value and a high dielectric breakdown voltage even when the film thickness is 1 μm or less.

Further, by using the dielectric film according to the present invention, it can cope with the miniaturization since a higher relative permittivity can be obtained comparing to the dielectric film conventionally used for high frequency electronic components. In addition, it is also possible to provide a dielectric resonator or a dielectric filter having a higher Q value (i.e., showing a higher S/N ratio), a higher dielectric breakdown voltage, that is, a higher ESD property than that of the conventional dielectric film.

The present invention can provide a dielectric film and an electronic component using the same, wherein the dielectric film contains an alkaline earth metal oxide having a NaCl type crystal structure as a main component, and has a high relative permittivity, a high Q value and a high dielectric breakdown voltage even when the film thickness is 1 μm or less.

DETAILED DESCRIPTION OF EMBODIMENTS

Hereinafter, the preferable embodiments of the present invention will be described with reference to the drawings.

(Thin Film Capacitor 10)

Figure 1:
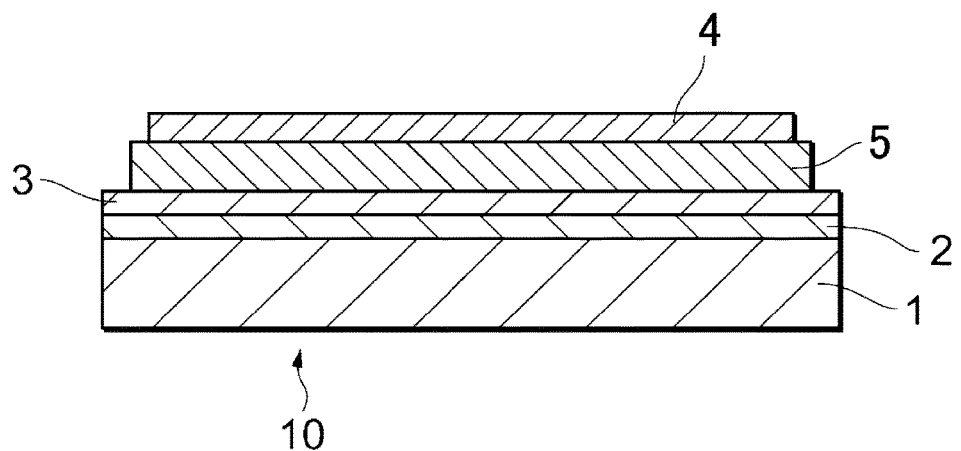
FIG. 1 is a sectional view of a thin film capacitor in one embodiment of the present invention.

FIG. 1 is a sectional view of thin film capacitor 10 as an example of the electronic component using the dielectric film in one embodiment of the present invention. Thin film capacitor 10 is provided with lower electrode 3, upper electrode 4 and dielectric film 5 disposed between lower electrode 3 and upper electrode 4, which are laminated on the surface of supporting substrate 1. Foundation layer 2 is provided between supporting substrate 1 and lower electrode 3 to enhance the adhesion between them. Further, supporting substrate 1 has a function of guaranteeing the mechanical strength of the whole thin film capacitor 10.

The shape of the thin film capacitor is not particularly restricted and is usually rectangular. Also, its size is not particularly restricted. The thickness or the length can be appropriately set in accordance with the uses.

(Supporting Substrate 1)

There is no particular restriction on the material for forming supporting substrate 1 as shown in FIG. 1. For instance, single crystal such as single crystal Si, single crystal SiGe, single crystal GaAs, single crystal InP, single crystal $SrTiO_3$, single crystal MgO, single crystal $LaAlO_3$, single crystal $ZrO_2$, single crystal $MgAl_2O_4$ and single crystal $NdGaO_3$, or ceramic polycrystalline substrate such as polycrystal $Al_2O_3$, polycrystal ZnO and polycrystal $SiO_2$, or substrate of metal such as Ni, Cu, Ti, W, Mo, Al, Pt or the like or the alloy thereof can form supporting substrate 1, but there is no particular restriction. Among these materials, the single crystal Si is usually used as supporting substrate 1 from the viewpoint of the low cost and good process abilities. The resistivity of supporting substrate 1 varies depending on the material of the substrate. When a kind of material having a low resistivity is used as supporting substrate 1, the current leakage to supporting substrate 1 side will affect the electric properties of thin film capacitor 10 if such a substrate is directly used. Thus, sometimes an insulating treatment can be provided to the surface of supporting substrate 1 so as to prevent the current in use from flowing to supporting substrate 1. For example, when single crystal Si is used as supporting substrate 1, the surface of supporting substrate 1 can be oxidized to form an insulating layer of $SiO_2$. Alternatively, insulating layers of $Al_2O_3$, $SiO_2$, $SiN_x$ or the like can be formed on the surface of supporting substrate 1. The material for the insulating layer or the thickness of the film is not restricted as long as supporting substrate 1 can be kept insulated. However, the film thickness is preferred to be 0.01 μm or more. A thickness less than 0.01 μm cannot guarantee the insulation and thus is not preferred as the thickness of the insulating layer. There is no particular restriction for the thickness of supporting substrate 1 as long as the mechanical strength of the whole thin film capacitor can be ensured. For example, the thickness can be set to be 10 μm to 5000 μm. When the thickness is thinner than 10 μm, sometimes the mechanical strength cannot be ensured. On the other hand, if the thickness is thicker than 5000 μm, it cannot contribute to the downsizing of the electronic component.

(Foundation Layer 2)

In the present embodiment, it is preferable to have foundation layer 2 on the surface of supporting substrate 1 having been subjected to the insulating treatment. Foundation layer 2 is inserted for the purpose of improving the adhesion between supporting substrate 1 and lower electrode 3. For example, Cr is usually inserted as foundation layer 2 when Cu is used in lower electrode 3 and Ti is usually inserted as foundation layer 2 when Pt is used in lower electrode 3.

It is not restricted to the materials exemplified above because the purpose of foundation layer 2 is to improve the adhesion between supporting substrate 1 and lower electrode 3. In addition, foundation layer 2 can be omitted if the adhesion between supporting substrate 1 and lower electrode 3 can be guaranteed.

(Lower Electrode 3)

The material for forming lower electrode 3 is not particularly restricted as long as it has conductivity. For instance, lower electrode 3 can be formed by metals such as Pt, Ru, Rh, Pd, Ir, Au, Ag, Cu, Ni and the like or their alloy or the conductive oxide thereof. In this respect, the material can be selected in accordance with the cost or the atmosphere during the thermal treatment for dielectric film 5. In addition to air, the thermal treatment to dielectric film 5 can also be performed under an inert gas such as $N_2$ or Ar or a mixed gas of $O_2$, inert gas(es) and reductive gas $H_2$. The film thickness of lower electrode 3 is not particularly restricted as long as lower electrode 3 can function as an electrode. Further, the thickness is preferred to be 10 nm or more. A thickness less than 10 nm is not preferable because the conduction property will deteriorate in that case. In addition, when a substrate formed by using Cu or Ni, Pt or the like or a conductive oxide material (which can be utilized as an electrode) is used as supporting substrate 1, foundation layer 2 and lower electrode 3 mentioned above can be omitted.

A thermal treatment can be performed following the formation of the lower electrode 3 so as to improve the adhesion between foundation layer 2 and lower electrode 3 and also to improve the stability of lower electrode 3. When a thermal treatment is performed, the heating rate of the temperature is preferably 10° C./min to 2000° C./min, and more preferably 100° C./min to 1000° C./min. The holding temperature during the thermal treatment is preferably 100° C. to 800° C., and the holding time is preferred to be 0.1 hour to 4.0 hours. If any parameter goes beyond the ranges mentioned above, the adhesion will not be good and the surface of lower electrode 3 will be uneven so that the dielectric properties of dielectric film 5 is likely to deteriorate.

(Dielectric Film 5)

Dielectric film 5 is characterized in that it comprises an alkaline earth metal oxide having a NaCl type crystal structure as a main component, and has a (111)-oriented columnar structure in the direction perpendicular to the surface of the dielectric film, wherein in the Cu—Kα X-ray diffraction chart of the dielectric film, the half width of the diffraction peak of (111) is in a range of from 0.3° to 2.0°.

The dielectric film having the characters above can have a high relative permittivity, a high Q value and a high dielectric breakdown voltage even when the film thickness is 1 μm or less.

The inventors of the present invention have considered the reasons for obtaining such effects as follows. First, the reasons for achieving high relative permittivity and high Q value will be explained. Generally, it is known that, in the state where the symmetry of the crystals is good and atoms or molecules are regularly arranged, i.e., when the crystallinity is good, a high dielectric constant and a high Q value is provided. When a dielectric material having a good crystallinity is prepared into a thin film, the conventional crystal structure tends to collapse, the symmetry of the crystal will be disordered, the arrangement of atoms or molecules will not be maintained, that is, the crystallinity will be lowered, thus, the relative permittivity and the Q value tends to decrease easily.

It is considered that even in the case of a dielectric film containing an alkaline earth metal oxide having a NaCl type crystal structure as a main component, since it has high crystallinity as described above, the crystallinity will be lowered and high relative permittivity or high Q value could not be obtained when it is formed into a thin film in the conventional technology. Thus, it is necessary to maintain the conventional high crystallinity during the process of thin film forming. It is considered that in the dielectric film containing an alkaline earth metal oxide having a NaCl type crystal structure as a main component, the disorder of the crystal structure (i.e., the decrease of the crystallinity) can be prevented by having a (111)-oriented columnar structure in the direction perpendicular to the surface of the dielectric film. As the result, a high relative permittivity and a high Q value can be obtained even if it is formed as a thin film. On the other hand, in the case where a (111)-oriented columnar structure is not provided, the crystallinity will be lowered and it will be difficult to obtain a high relative permittivity and a high Q value when the dielectric material is formed into a thin film.

The columnar structure which is one of characters of the present invention shown above will be explained.

Figure 2:
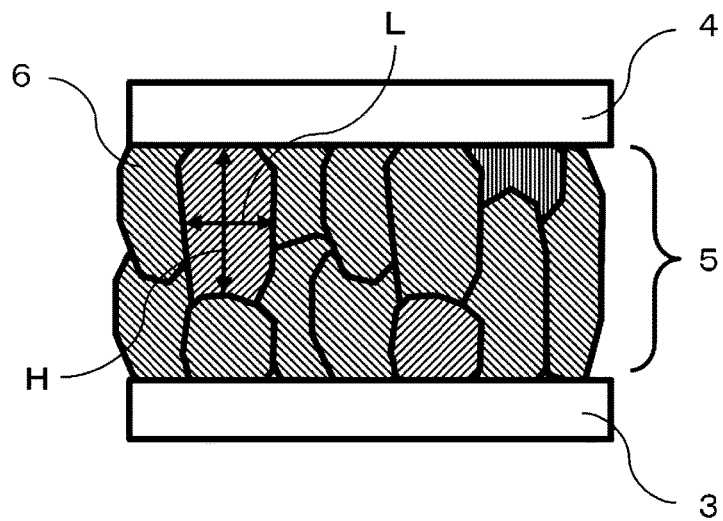
FIG. 2 is a figure showing the columnar structure of the dielectric film in one embodiment of the present invention.

As shown in FIG. 2, the columnar structure of the present invention means a structure having a crystallite 6 which is long in the thickness direction of the dielectric film when observed in a cross section in the vertical direction of the dielectric film. The columnar structure of the present invention is a structure constructed by crystallites which extends along the normal direction or a direction in a range of ±5° relative to the normal direction of the surface of the supporting substrate in the whole dielectric film. The ratio of H to L (i.e., the aspect ratio) of the crystallites described in FIG. 2 satisfies (H/L)≥2.

Next, the reason why a high dielectric breakdown voltage could be realized will be described. Generally, it is said that the dielectric breakdown voltage of a dielectric film having an oriented columnar structure will be low since many grain boundaries exist in the film thickness direction. For this reason, in most cases, by spheroidizing the shape of the crystal grains constituting the dielectric film and further forming a number of grain boundaries in directions other than the film thickness direction, the conduction path is complicated and the breakdown voltage is improved. However, in this method, since many grain boundaries are formed in directions other than the film thickness direction, there was a problem that the Q value tends to decrease. Therefore, in the present invention, a high dielectric breakdown voltage is realized without decreasing the Q value by miniaturizing the size of the crystallite while maintaining the aspect ratio of the crystallites constituting the columnar structure which is a character of the present invention rather than forming spherical crystal grains.

Figure 3:
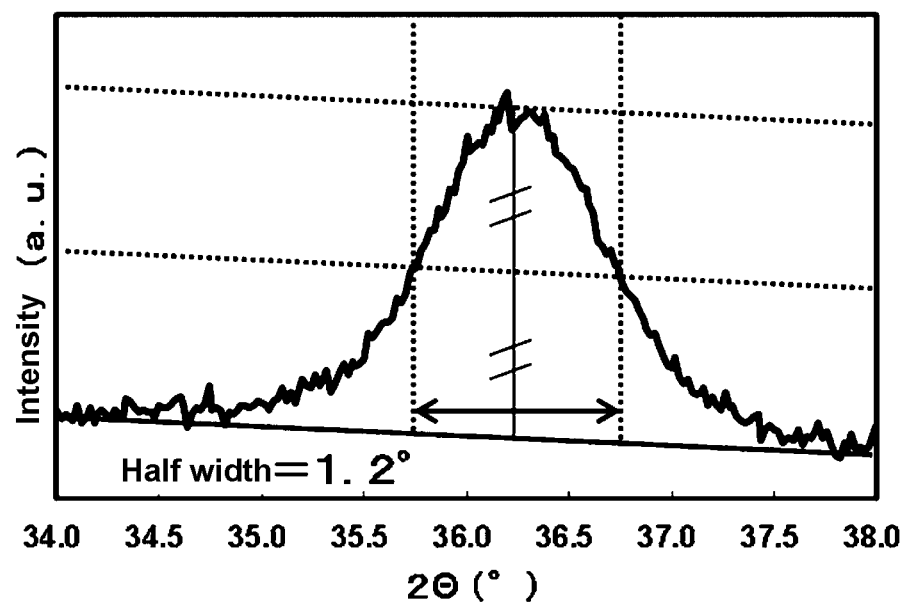
FIG. 3 is a Cu—Kα X-ray diffraction chart of the dielectric film in one embodiment of the present invention.

As described above, when the size of the crystallites constituting the columnar structure is reduced, the presence of the crystallites can be confirmed by the half width of the diffraction peak obtained by the X-ray diffraction chart as shown in FIG. 3 using a CuKα ray to perform the measurement. In the case of the present invention, the size of the crystallite can be confirmed by the half width of the diffraction peak of (111). The smaller the half width is, the larger the size of the crystallite is, and the larger the value of the half width is, the smaller the crystallite size is.

In dielectric film 5 according to the embodiment of the present invention, the columnar structure is constructed by small crystallites by controlling the half width of the diffraction peak of (111) to be in a range of from 0.3° to 2.0° in the Cu—Kα X-ray diffraction chart of the dielectric film, thus, a high relative permittivity and a high Q value can be maintained and a higher dielectric breakdown voltage can be obtained. When the half width is less than 0.3°, the size of the crystallites constituting the columnar structure becomes too large and it tends to be difficult to obtain a high dielectric breakdown voltage. On the other hand, if the half width exceeds 2.0°, the size of the crystallite becomes too small, the crystallinity will decrease, and it will be difficult to obtain a high relative permittivity and a high Q value.

As described above, the dielectric film containing an alkaline earth metal oxide having a NaCl type crystal structure with a high crystallinity as a main component can be provided with a high relative permittivity, a high Q value and a higher dielectric breakdown voltage by having a (111)-oriented columnar structure in the direction perpendicular to the surface of the dielectric film and controlling the half width of the diffraction peak of (111) to be in a range of from 0.3° to 2.0° in the Cu—Kα X-ray diffraction chart of the dielectric film.

In addition, in a preferred embodiment of the present invention, dielectric film 5 is preferred to contain at least one element selected from the group consisting of Ta, Nb, V, Hf, Zr, Ti and Zn as a subcomponent besides containing an alkaline earth metal oxide having a NaCl type crystal structure as a main component.

By containing at least one element selected from the group consisting of Ta, Nb, V, Hf, Zr, Ti and Zn as a subcomponent, it becomes easy to control the size of the crystallites constituting the columnar structure and the effect of increasing the insulation resistance of the columnar structure itself will be further enhanced. As a result, it is possible to obtain a higher dielectric breakdown voltage by containing a subcomponent comparing to the case where no subcomponent is contained.

Further, when the total content of the subcomponents is set as x, it is preferable that the total content x is in the range of 0 mol %<x≤20 mol % relative to the main component.

By setting the total content x of the subcomponent within the above range, both of the effects of easily controlling the size of the crystallites constituting the columnar structure and the effects of enhancing the insulation resistance of the columnar structure itself can be enhanced, and the effect of increasing the crystallinity of the dielectric film containing alkaline earth metal oxide having a NaCl type crystal structure as a main component becomes strong. As a result, it is possible to further increase the Q value while maintaining a high dielectric breakdown voltage.

The thickness of dielectric film 5 is preferably 10 nm to 2000 nm, and more preferably 50 nm to 1000 nm. If the thickness is less than 10 nm, the dielectric breakdown is likely to happen. When the thickness exceeds 2000 nm, the area of the electrode needs to be broadened so as to increase the electrostatic capacity in the capacitor, and it may be hard to downsize depending on the designs of the electronic component. In the measurement of the thickness of the dielectric film, the dielectric film can be excavated by a FIB (Focused Ion Beam) processing device, and then the obtained cross section is observed through a SIM (Scanning Ion Microscope) or the like to measure the length.

Dielectric film 5 is preferably formed by various methods for film-forming such as vacuum evaporation method, sputtering method, PLD (Pulsed Laser Deposition method), MBE (Molecular Beam Epitaxy method), MO-CVD (Metal-Organic Chemical Vapor Deposition method), MOD (Metal Organic Decomposition method) or Sol-Gel method, CSD (Chemical Solution Deposition method) or the like. Sometimes a trace of impurities or subcomponents may be contained in the raw material in use (the deposition material, various target materials, organometalic material and etc.), but no particular problem will arise even if they are contained as long as they will not significantly deteriorate the insulation properties.

Further, a trace of impurities or subcomponents may be contained in dielectric film 5 of the present invention as long as they do not significantly deteriorate the effects of the present invention (i.e., the relative permittivity, the Q value or the dielectric breakdown voltage). Thus, the amount of the main component as the balance is not particularly restricted. For example, the amount of the main component is 80% or more and 100% or less relative to the whole dielectric film comprising the main component.

In addition, dielectric film 5 usually only consists of the dielectric film of the present invention, but it can also be a laminated structure in combination with other dielectric films. For example, by making into a laminated structure with the conventional amorphous dielectric films or the crystalline films such as $Si_3N_x$, $SiO_x$, $Al_2O_x$, $ZrO_x$, $Ta_2O_x$ or the like, the impedance or the temperature change of relative permittivity of dielectric film 5 can be adjusted. Further, by using the laminated structure, dielectric film 5 can be prevented from exposure under the atmosphere.

(Upper Electrode 4)

In one example of the present embodiment, thin film capacitor 10 is provided with upper electrode 4 on the surface of dielectric film 5, wherein upper electrode 4 functions as another electrode in thin film capacitor 10. The material for forming upper electrode 4 is not particularly restricted as long as it is conductive. Upper electrode 4 can be formed by the same material as that of lower electrode 3. The film thickness of upper electrode 4 is not particularly restricted as long as the function as an electrode can be exerted, and the film thickness is preferred to be 10 nm or more. A film thickness of 10 nm or less is not preferable for upper electrode 4 because the conductivity will deteriorate in that case.

In the embodiment mentioned above, a thin film capacitor is exemplified as an example of the electronic component using the dielectric film involved in one embodiment of the present invention. However, the electronic component using the dielectric film of the present invention is not limited to the thin film capacitor and also can be any electronic component having a dielectric film such as a diplexer, a band-pass filter, a balun or a coupler.

EXAMPLES

Hereinafter, the present invention will be further described based on detailed Examples, but the present invention is not limited to these Examples.

(Example 1) (Comparative Example 1)

First of all, a Cr thin film as the foundation layer with a thickness of 20 nm was formed by sputtering method on a surface of a supporting substrate of 10 mm×10 mm square. The supporting substrate had a $SiO_2$ insulating layer with a thickness of 6 μm on a surface of Si with a thickness of 350 μm.

Next, a Cu thin film as the lower electrode with a thickness of 100 nm was formed by sputtering on the foundation layer of the formed Cr thin film mentioned above.

The formed Cr/Cu thin film was subjected to a thermal treatment under ordinary pressure in nitrogen atmosphere with a heating rate of 10° C./min and a holding temperature of 150° C. and a temperature holding time of 0.5 hour.

The sputtering method was used in the formation of the dielectric film. The targets necessary in the formation of the dielectric film were prepared as follow.

First, $MgCO_3$, $CaCO_3$, $SrCO_3$, $BaCO_3$, $Ta_2O_5$, $Nb_2O_5$, $V_2O_5$, $HfO_2$, $ZrO_2$, $TiO_2$ and ZnO were weighed to obtain the amounts of Mg, Ca, Sr, Ba, Ta, Nb, V, Hf, Zr, Ti and Zn for Sample No. 1 to Sample No. 47 as shown in Table 1. The weighed raw powders together with absolute ethanol and $ZrO_2$ beads of ϕ2 mm were put into a wide-mouth poly-pot of 1 L and then subjected to wet mixing for 20 hours. Then, the slurry of the mixed powder was dried at 100° C. for 20 hours. The obtained mixed powder was put into a crucible made of $Al_2O_3$ and kept under 1250° C. for 5 hours in atmospheric air to obtain a calcinated powder.

The obtained calcinated powder was molded by using a uniaxial pressing machine to obtain a molded compact. The condition for molding is set with the pressure being $2.0 \times 10^8$ Pa and the temperature being room temperature.

After that, for the obtained molded compact, a sintering process was performed under ordinary pressure in atmospheric air with a heating rate of 200° C./hour and a holding temperature of 1600° C. to 1700° C. and a temperature holding time of 12 hours.

The obtained sintered compact was ground on both surfaces using a cylindrical grinding machine until its thickness became 4 mm to obtain a target for sputtering necessary in the formation of dielectric film.

Thus prepared target for sputtering was used to form a dielectric film with a thickness of 800 nm on the lower electrode under the conditions for film forming as shown in Table 1 by the sputtering method. Further, in order to expose part of the lower electrode, a metal mask was used to form an area where the dielectric film was not partially formed.

TABLE 1

$0 \leq x \leq 20$

|  | Sample No. | Main component (mol) | | | | Amount of subcomponent (mol %) | | | | | | | Total amount (mol %) | Condition for film forming | | |
|---|---|---|---|---|---|---|---|---|---|---|---|---|---|---|---|---|
|  |  | MgO | CaO | SrO | BaO | Ta | Nb | V | Hf | Zr | Ti | Zn |  | Gas species | Pressure (Pa) | Temperature for film forming (° C.) |
| Example 1 | 1 | 100.0 | — | — | — | — | — | — | — | — | — | — | 0.0 | Ar | 0.1 | 200 |
|  | 2 | — | 100.0 | — | — | — | — | — | — | — | — | — | 0.0 | Ar | 0.1 | 200 |
|  | 3 | — | — | 100.0 | — | — | — | — | — | — | — | — | 0.0 | Ar | 0.1 | 200 |
|  | 4 | — | — | — | 100.0 | — | — | — | — | — | — | — | 0.0 | Ar | 0.1 | 200 |
|  | 5 | 80.0 | 20.0 | — | — | — | — | — | — | — | — | — | 0.0 | Ar | 0.1 | 200 |
|  | 6 | 60.0 | 20.0 | 20.0 | — | — | — | — | — | — | — | — | 0.0 | Ar | 0.1 | 200 |
|  | 7 | 40.0 | 20.0 | 20.0 | 20.0 | — | — | — | — | — | — | — | 0.0 | Ar | 0.1 | 200 |
|  | 8 | 60.0 | — | 20.0 | 20.0 | — | — | — | — | — | — | — | 0.0 | Ar | 0.1 | 200 |
|  | 9 | 80.0 | — | — | 20.0 | — | — | — | — | — | — | — | 0.0 | Ar | 0.1 | 200 |
|  | 10 | — | 80.0 | 20.0 | — | — | — | — | — | — | — | — | 0.0 | Ar | 0.1 | 200 |
|  | 11 | — | 60.0 | 20.0 | 20.0 | — | — | — | — | — | — | — | 0.0 | Ar | 0.1 | 200 |
|  | 12 | — | 20.0 | — | 80.0 | — | — | — | — | — | — | — | 0.0 | Ar | 0.1 | 200 |
|  | 13 | — | — | 50.0 | 50.0 | — | — | — | — | — | — | — | 0.0 | Ar | 0.1 | 200 |
|  | 14 | 25.0 | 25.0 | 25.0 | 25.0 | — | — | — | — | — | — | — | 0.0 | Ar | 0.1 | 200 |
|  | 15 | 40.0 | 20.0 | 20.0 | 20.0 | 1.0 | — | — | — | — | — | — | 1.0 | Ar | 0.1 | 200 |
|  | 16 | 40.0 | 20.0 | 20.0 | 20.0 | — | 1.0 | — | — | — | — | — | 1.0 | Ar | 0.1 | 200 |
|  | 17 | 40.0 | 20.0 | 20.0 | 20.0 | — | — | 1.0 | — | — | — | — | 1.0 | Ar | 0.1 | 200 |
|  | 18 | 40.0 | 20.0 | 20.0 | 20.0 | — | — | — | 5.0 | — | — | — | 5.0 | Ar | 0.1 | 200 |
|  | 19 | 40.0 | 20.0 | 20.0 | 20.0 | — | — | — | — | 5.0 | — | — | 5.0 | Ar | 0.1 | 200 |
|  | 20 | 40.0 | 20.0 | 20.0 | 20.0 | — | — | — | — | — | 5.0 | — | 5.0 | Ar | 0.1 | 200 |
|  | 21 | 40.0 | 20.0 | 20.0 | 20.0 | — | — | — | — | — | — | 10.0 | 10.0 | Ar | 0.1 | 200 |
|  | 22 | — | 60.0 | 20.0 | 20.0 | 5.0 | 5.0 | — | — | — | — | — | 10.0 | Ar | 0.1 | 200 |
|  | 23 | — | 60.0 | 20.0 | 20.0 | 5.0 | — | 5.0 | — | — | — | — | 10.0 | Ar | 0.1 | 200 |
|  | 24 | — | 60.0 | 20.0 | 20.0 | 5.0 | — | — | 10.0 | — | — | — | 15.0 | Ar | 0.1 | 200 |
|  | 25 | — | 60.0 | 20.0 | 20.0 | 10.0 | — | — | — | 5.0 | — | — | 15.0 | Ar | 0.1 | 200 |
|  | 26 | — | 60.0 | 20.0 | 20.0 | 5.0 | — | — | — | — | 10.0 | — | 15.0 | Ar | 0.1 | 200 |
|  | 27 | — | 60.0 | 20.0 | 20.0 | 10.0 | — | — | — | — | — | 10.0 | 20.0 | Ar | 0.1 | 200 |
|  | 28 | — | — | 50.0 | 50.0 | — | 10.0 | 5.0 | 5.0 | — | — | — | 20.0 | Ar | 0.1 | 200 |
|  | 29 | — | — | 50.0 | 50.0 | — | 5.0 | 5.0 | 5.0 | 5.0 | — | — | 20.0 | Ar | 0.1 | 200 |
|  | 30 | — | — | 50.0 | 50.0 | — | — | — | — | 10.0 | 5.0 | 6.0 | 21.0 | Ar | 0.1 | 200 |
|  | 31 | 25.0 | 25.0 | 25.0 | 25.0 | — | 11.0 | 10.0 | — | — | — | — | 21.0 | Ar | 0.1 | 200 |
|  | 32 | 25.0 | 25.0 | 25.0 | 25.0 | — | — | — | — | — | 7.0 | 14.0 | 21.0 | Ar | 0.1 | 200 |
|  | 33 | 25.0 | 25.0 | 25.0 | 25.0 | 5.0 | — | 5.0 | 5.0 | — | 5.0 | 5.0 | 25.0 | Ar | 0.1 | 200 |
|  | 34 | 25.0 | 25.0 | 25.0 | 25.0 | — | 5.0 | 3.0 | 2.0 | 5.0 | 5.0 | 5.0 | 25.0 | Ar | 0.1 | 200 |
|  | 35 | 25.0 | 25.0 | 25.0 | 25.0 | 3.0 | 2.0 | 3.0 | 2.0 | 5.0 | 4.0 | 6.0 | 25.0 | Ar | 0.1 | 200 |
| Comparative example 1 | 36 | 100.0 | — | — | — | — | — | — | — | — | — | — | 0.0 | Ar + O2 | 0.1 | 200 |
|  | 37 | 80.0 | — | — | 20.0 | — | — | — | — | — | — | — | 0.0 | Ar + O2 | 0.1 | 200 |
|  | 38 | 40.0 | 20.0 | 20.0 | 20.0 | — | — | — | — | 5.0 | — | — | 5.0 | Ar + O2 | 0.1 | 200 |
|  | 39 | — | — | 50.0 | 50.0 | — | 5.0 | 5.0 | 5.0 | 5.0 | — | — | 20.0 | Ar + O2 | 0.1 | 200 |
|  | 40 | 100.0 | — | — | — | — | — | — | — | — | — | — | 0.0 | Ar | 0.5 | 200 |
|  | 41 | 80.0 | — | — | 20.0 | — | — | — | — | — | — | — | 0.0 | Ar | 0.5 | 200 |
|  | 42 | 40.0 | 20.0 | 20.0 | 20.0 | — | — | — | — | 5.0 | — | — | 5.0 | Ar | 0.5 | 200 |
|  | 43 | — | — | 50.0 | 50.0 | — | 5.0 | 5.0 | 5.0 | 5.0 | — | — | 20.0 | Ar | 0.5 | 200 |
|  | 44 | 100.0 | — | — | — | — | — | — | — | — | — | — | 0.0 | Ar + O2 | 0.1 | RT |
|  | 45 | 80.0 | — | — | 20.0 | — | — | — | — | — | — | — | 0.0 | Ar + O2 | 0.1 | RT |
|  | 46 | 40.0 | 20.0 | 20.0 | 20.0 | — | — | — | — | 5.0 | — | — | 5.0 | Ar + O2 | 0.1 | RT |
|  | 47 | — | — | 50.0 | 50.0 | — | 5.0 | 5.0 | 5.0 | 5.0 | — | — | 20.0 | Ar + O2 | 0.1 | RT |

In the table, "—" meant that it was not contained.

In the measurement of the thickness of the dielectric film, the dielectric film was excavated by FIB and then the resultant cross section was observed by SIM to measure the length.

After film-forming, the composition of the dielectric film was analyzed for all samples by using XRF (X-Ray Fluorescence Analysis). It had been confirmed that the composition was identical to that described in Table 1.

Further, with respect to all the obtained dielectric films, the crystal structure and the crystallinity were confirmed by the following methods respectively.

<Columnar Structure>

The columnar structure was confirmed by observing the cross section of the dielectric film using TEM. The aspect ratio of crystallites was measured in the dark field image. A film composed of crystallites having an aspect ratio of 2 or more was defined as a film having a columnar structure.

<Crystal Orientation and Crystallinity>

The dielectric film was measured by X-ray diffraction (parallel method) to obtain a diffraction pattern. Cu—Kα ray was used as the X-ray source, and the conditions for measuring were set to have a voltage of 45 kV, 200 mA, and a range of 2θ=20° to 80°. Regarding the orientation of the dielectric film, when comparing the ratio of the peak intensity of (111) to the peak intensity of (200) in the obtained diffraction pattern, the ratio (peak intensity of (111)/peak intensity of (200)) is 1.5 or more, and the dielectric film was defined as being oriented to (111). Further, as an index expressing crystallinity, the half width of the oriented surface was measured. FIG. 3 showed an example in which the half width was measured from the obtained diffraction pattern (Example 1 Sample No. 1).

Thereafter, a vapor deposition apparatus was used to form an Ag thin film as the upper electrode on the resultant dielectric film. The shape of the upper electrode was formed to have a diameter of 100 μm and a thickness of 100 nm by using a metal mask, thereby obtaining Sample No. 1 to Sample No. 45 with the structure shown in FIG. 1.

As for all the obtained thin film capacitor samples, relative permittivity, Q value and dielectric breakdown voltage were respectively measured through the following methods.

<Relative Permittivity and Q Value>

Referring to the relative permittivity and the Q value (no unit for both), the electrostatic capacity and the dielectric loss (tan δ) were measured under a frequency of 2 GHz and an input signal level (measuring voltage) of 0.5 Vrms at a reference temperature of 25° C. using a RF impedance/material analyzer (4991A, produced by Agilent Technologies). The relative permittivity was calculated based on the measurement results of the electrostatic capacity and film thickness, and the Q value was calculated from the reciprocal of the dielectric loss (1/tan δ). The relative permittivity of an amorphous $SiN_x$ film was about 7, thus, in the present invention, a relative permittivity higher than this was deemed as a good result. Further, the Q value of an amorphous $SiN_x$ film was about 500, but since components with better high-frequency properties were demanded in recent years, a Q value of 850 or more was deemed as a good result.

<Dielectric Breakdown Voltage>

As for the thin film capacitor samples, a digital ultra-high resistance/micro current meters (ADVANTEST R8340) was connected with the exposed area of the lower electrode and also the upper electrode. A voltage was applied in a step of 5V/second to perform the measurement, and the voltage value was read at the time when the resistance value dropped by two orders of magnitude from the initial resistance value. The value was regarded as the breakdown voltage value (the unit was V) of the sample. The value obtained by dividing the breakdown voltage value (the unit was V) by the thickness of the dielectric film was deemed as the dielectric breakdown voltage (Vbd) (V/μm). In Table 2, an average value of n=5 was described. The dielectric breakdown voltage of amorphous $SiN_x$ was about 500V/μm to 700V/μm, but in recent years, components were demanded to have a better ESD property, thus, a dielectric breakdown voltage of 1250 V/μm or higher was deemed as a good result.

TABLE 2

|  | Sample No. | Thickness of the film (nm) | (111)-Oriented Columnar structure | Half width (°) | Relative permittivity (−) | Q value (−) | Vbd (V/μm) |
|---|---|---|---|---|---|---|---|
| Example 1 | 1 | 800 | ○ | 0.3 | 14 | 1000 | 1250 |
|  | 2 | 800 | ○ | 0.4 | 15 | 1050 | 1280 |
|  | 3 | 800 | ○ | 0.5 | 14 | 1030 | 1290 |
|  | 4 | 800 | ○ | 0.5 | 15 | 1040 | 1250 |
|  | 5 | 800 | ○ | 0.4 | 14 | 1030 | 1260 |
|  | 6 | 800 | ○ | 0.6 | 14 | 1050 | 1270 |
|  | 7 | 800 | ○ | 0.8 | 15 | 1040 | 1290 |
|  | 8 | 800 | ○ | 0.9 | 15 | 1030 | 1280 |
|  | 9 | 800 | ○ | 1.0 | 14 | 1020 | 1290 |
|  | 10 | 800 | ○ | 0.6 | 14 | 1050 | 1250 |
|  | 11 | 800 | ○ | 0.6 | 15 | 1040 | 1250 |
|  | 12 | 800 | ○ | 0.9 | 14 | 1010 | 1280 |
|  | 13 | 800 | ○ | 1.1 | 15 | 1020 | 1290 |
|  | 14 | 800 | ○ | 1.2 | 14 | 1040 | 1300 |
|  | 15 | 800 | ○ | 1.3 | 15 | 1080 | 1350 |
|  | 16 | 800 | ○ | 1.3 | 14 | 1090 | 1360 |
|  | 17 | 800 | ○ | 1.3 | 14 | 1080 | 1350 |
|  | 18 | 800 | ○ | 1.4 | 15 | 1070 | 1360 |
|  | 19 | 800 | ○ | 1.4 | 15 | 1090 | 1350 |
|  | 20 | 800 | ○ | 1.4 | 15 | 1080 | 1360 |
|  | 21 | 800 | ○ | 1.6 | 14 | 1090 | 1370 |
|  | 22 | 800 | ○ | 1.6 | 14 | 1090 | 1370 |
|  | 23 | 800 | ○ | 1.6 | 15 | 1080 | 1380 |
|  | 24 | 800 | ○ | 1.6 | 15 | 1080 | 1390 |
|  | 25 | 800 | ○ | 1.8 | 14 | 1090 | 1390 |
|  | 26 | 800 | ○ | 1.8 | 14 | 1070 | 1400 |
|  | 27 | 800 | ○ | 1.8 | 15 | 1090 | 1400 |
|  | 28 | 800 | ○ | 1.8 | 14 | 1080 | 1390 |
|  | 29 | 800 | ○ | 1.8 | 15 | 1090 | 1400 |
|  | 30 | 800 | ○ | 1.9 | 14 | 1040 | 1390 |
|  | 31 | 800 | ○ | 1.9 | 15 | 1040 | 1390 |
|  | 32 | 800 | ○ | 1.9 | 14 | 1030 | 1390 |
|  | 33 | 800 | ○ | 2.0 | 14 | 1020 | 1390 |
|  | 34 | 800 | ○ | 2.0 | 14 | 1030 | 1400 |
|  | 35 | 800 | ○ | 2.0 | 14 | 1030 | 1400 |
| Comparative Example 1 | 36 | 800 | × | 1.2 | 15 | 840 | 1250 |
|  | 37 | 800 | × | 1.2 | 14 | 830 | 1290 |
|  | 38 | 800 | × | 1.4 | 14 | 830 | 1350 |
|  | 39 | 800 | × | 1.8 | 15 | 840 | 1400 |
|  | 40 | 800 | ○ | 0.2 | 14 | 1050 | 1200 |
|  | 41 | 800 | ○ | 0.2 | 14 | 1060 | 1150 |
|  | 42 | 800 | ○ | 2.1 | 15 | 840 | 1360 |
|  | 43 | 800 | ○ | 2.1 | 15 | 830 | 1400 |
|  | 44 | 800 | × | 0.2 | 14 | 830 | 1150 |
|  | 45 | 800 | × | 0.2 | 14 | 820 | 1160 |

TABLE 2-continued

| Sample No. | Thickness of the film (nm) | (111)-Oriented Columnar structure | Half width (°) | Relative permittivity (−) | Q value (−) | Vbd (V/μm) |
|---|---|---|---|---|---|---|
| 46 | 800 | x | 2.1 | 14 | 790 | 1210 |
| 47 | 800 | x | 2.1 | 14 | 780 | 1200 |

In the table, ○ represented a case where a (111)-oriented columnar structure was present, and x represented a case not including the above structure.

Sample No. 1 to Sample No. 14

From Table 2, it was confirmed that, Sample No. 1 to Sample No. 14 had good properties with the Q value being 850 or more and the dielectric breakdown voltage being 1250 V/μm or more even if the samples were prepared as thin films of 800 nm, wherein each of Sample No. 1 to Sample No. 14 was a dielectric film comprising an alkaline earth metal oxide having a NaCl type crystal structure as a main component and had a (111)-oriented columnar structure in a direction perpendicular to the surface of the dielectric film, and in a Cu—Kα X-ray diffraction chart of the dielectric film, a half width of the diffraction peak of (111) was in a range of from 0.3° to 2.0°.

Sample No. 15 to Sample No. 35

From Table 2, it was confirmed that, Sample No. 15 to Sample No. 35 had higher breakdown voltage than that of Sample No. 1 to Sample No. 14, wherein each of Sample No. 15 to Sample No. 35 was a dielectric film comprising an alkaline earth metal oxide having a NaCl type crystal structure as a main component and had a (111)-oriented columnar structure in the direction perpendicular to the surface of the dielectric film, and in a Cu—Kα X-ray diffraction chart of the dielectric film, a half width of the diffraction peak of (111) was in a range of from 0.3° to 2.0°, and further contained at least one element selected from the group consisting of Ta, Nb, V, Hf, Zr, Ti and Zn as a subcomponent; while each of Sample No. 1 to Sample No. 14 contained no subcomponent. Further, it could be confirmed that, each of Sample No. 15 to Sample No. 29 which contained subcomponents in a range of 0 mol %<x≤20 mol % relative to the main component had a Q value of 1050 or more and a dielectric breakdown voltage of 1350 V/μm or more.

Sample No. 36 to Sample No. 47

From Table 2, it could be seen that, each of Sample No. 36 to Sample No. 39 which were comparative examples did not have a (111)-oriented columnar structure, thus, the crystallinity decreased and the Q value became as low as 850 or less when they were prepared as thin films. In each of Sample No. 40 and Sample No. 41 which were comparative examples, it had a (111)-oriented columnar structure, but a half width was 0.2°, thus, there was no contribution for the dielectric breakdown voltage and the dielectric breakdown voltage was 1240 V/μm or less. Further, in each of Sample No. 42 and Sample No. 43 which were comparative examples, it had a (111)-oriented columnar structure and a half width was 2.1° and the dielectric breakdown voltages were good, but the size of the crystallite became too small, thus, the Q value turned to be 850 or less. In addition, in each of Sample No. 44 to Sample No. 47 which were comparative examples, neither did it has a (111)-oriented columnar structure, nor a half width was in the range of the present invention, thus, the high Q value and the high dielectric breakdown voltage could not be maintained.

As described above, it could be confirmed that in a dielectric film containing an alkaline earth metal oxide having a NaCl type crystal structure as a main component, when the dielectric film had a (111)-oriented columnar structure in the direction perpendicular to the surface of the dielectric film and a half width of the diffraction peak of (111) was in a range of from 0.3° to 2.0° in the Cu—Kα X-ray diffraction chart of the dielectric film, a high relative permittivity, a high Q value and a high dielectric breakdown voltage could be maintained.

Next, examples were described which confirmed that the dielectric films having the characters of the present invention could be effective under various film thicknesses.

Example 2

Samples were prepared by using the same method as that for Sample No. 29 in Example 1 except that the thicknesses of the dielectric film were changed. Same evaluations were done as in Example 1. The results were shown in Table 3.

TABLE 3

| | Sample No. | Thickness of the film (nm) | (111)-Oriented Columnar structure | Half width (°) | Relative permittivity (−) | Q value (−) | Vbd (V/μm) |
|---|---|---|---|---|---|---|---|
| Example 2 | 48 | 500 | ○ | 1.8 | 15 | 910 | 1390 |
| | 49 | 200 | ○ | 1.8 | 15 | 920 | 1400 |
| | 50 | 50 | ○ | 1.8 | 15 | 920 | 1400 |

Sample No. 48 to Sample No. 50

From Table 3, it could be seen that, even if the film thicknesses of the dielectric films were different, the dielectric films showed properties almost the same even if the thickness was reduced by thinning the film to 50 nm as long as the dielectric film contained an alkaline earth metal oxide having a NaCl type crystal structure as a main component, and had a (111)-oriented columnar structure in the direction perpendicular to the surface of the dielectric film, and in the Cu—Kα X-ray diffraction chart of the dielectric film, a half width of the diffraction peak of (111) was in a range of from 0.3° to 2.0°. That was, it could be confirmed that as long as the dielectric film had the characters of the present invention, there was almost no deterioration in the properties and a high relative permittivity, a high Q value and a high breakdown voltage could be obtained even if it was made into a thin film.

As described above, the present invention relates to a dielectric film and an electronic component. In particular, the present invention provides a dielectric film and an electronic component using the same, in which the dielectric film has a high relative permittivity, a high Q value and a high dielectric breakdown voltage. Thereby, in the electronic component using the dielectric film, miniaturization and high function can be achieved. The present invention provides novel technologies for wide applications for thin film high frequency components such as a diplexer or a band-pass filter or the like.

DESCRIPTION OF REFERENCE NUMERALS

1 Supporting substrate
2 Foundation layer
3 Lower electrode
4 Upper electrode
5 Dielectric film
6 Crystallite
10 Thin film capacitor

What is claimed is:

1. A dielectric film, comprising an alkaline earth metal oxide having a NaCl type crystal structure as a main component, wherein
   the dielectric film has a (111)-oriented columnar structure in a direction perpendicular to the surface of the dielectric film, and
   in a Cu—Kα X-ray diffraction chart of the dielectric film, a half width of the diffraction peak of (111) is in a range of from 0.5° to 2.0°.
2. The dielectric film according to claim 1, wherein
   the dielectric film contains at least one element selected from the group consisting of Ta, Nb, V, Hf, Zr, Ti and Zn as a subcomponent.
3. The dielectric film according to claim 2, wherein
   when the total content of the subcomponents is set as x, the x is in the range of 0 mol %<x≤20 mol % relative to the main component.
4. An electronic component comprising the dielectric film according to claim 1.
5. An electronic component comprising the dielectric film according to claim 2.
6. An electronic component comprising the dielectric film according to claim 3.

* * * * *